United States Patent
Takai et al.

(10) Patent No.: US 9,450,134 B2
(45) Date of Patent: Sep. 20, 2016

(54) PHOTOCOUPLER

(71) Applicant: KABUSHIKI KAISHA TOSHIBA, Minato-ku (JP)

(72) Inventors: Naoya Takai, Fukuoka-ken (JP); Eiji Nakashima, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 14/025,027

(22) Filed: Sep. 12, 2013

(65) Prior Publication Data

US 2014/0284629 A1 Sep. 25, 2014

(30) Foreign Application Priority Data

Mar. 22, 2013 (JP) .................. 2013-061150

(51) Int. Cl.
| | | |
|---|---|---|
| H01L 31/173 | (2006.01) | |
| G02B 6/42 | (2006.01) | |
| H01L 31/16 | (2006.01) | |
| H01L 31/167 | (2006.01) | |
| H03K 17/785 | (2006.01) | |

(52) U.S. Cl.
CPC .......... *H01L 31/173* (2013.01); *G02B 6/4259* (2013.01); *H01L 31/165* (2013.01); *H01L 31/167* (2013.01); *H03K 17/785* (2013.01)

(58) Field of Classification Search
CPC .. H01L 31/173; H01L 33/405; G02B 6/4259
See application file for complete search history.

(56) References Cited

U.S. PATENT DOCUMENTS

| | | | | |
|---|---|---|---|---|
| 4,227,098 A | * | 10/1980 | Brown et al. ............... | 307/117 |
| 4,805,006 A | * | 2/1989 | Yamaguchi et al. ......... | 257/436 |
| 4,851,695 A | * | 7/1989 | Stein ........................... | 250/551 |
| 5,654,559 A | * | 8/1997 | Spaeth et al. ............... | 257/82 |
| 2008/0296520 A1 | | 12/2008 | Noguchi | |
| 2010/0270483 A1 | * | 10/2010 | Omura ........................ | 250/551 |

FOREIGN PATENT DOCUMENTS

| | | |
|---|---|---|
| JP | 61-156251 | 9/1986 |
| JP | 02-206182 A | 8/1990 |

(Continued)

OTHER PUBLICATIONS

Japanese Office Action issued May 29, 2015 in counterpart Japanese patent application No. 2013-061150, along with English translation thereof.

*Primary Examiner* — Stephen W Smoot
*Assistant Examiner* — Sun M Kim
(74) *Attorney, Agent, or Firm* — White & Case LLP

(57) ABSTRACT

According to one embodiment, a photocoupler includes a light emitting element, a light receiving element, a bonding layer, input terminals, output terminals and a molded resin body. A light emitting element includes a transparent support substrate, a semiconductor stacked body, and first and second electrodes. A light receiving element includes a light reception surface, a first electrode, and a second electrode. A bonding layer is configured to bond the first surface of the support substrate to the light reception surface side of the light receiving element. The bonding layer is transparent and insulative. Input terminals are connected to the first and second electrodes of the light emitting element. Output terminals are connected to the first and second electrodes of the light receiving element. The light reception surface is included in the light emitting surface. An input electrical signal is converted into an output electrical signal.

15 Claims, 7 Drawing Sheets

(56) References Cited

FOREIGN PATENT DOCUMENTS

| JP | 06291363 A | * | 10/1994 |
| JP | H06-291363 A | | 10/1994 |
| JP | 09-036413 A | | 2/1997 |
| JP | 11-150291 A | | 6/1999 |
| JP | 2008-091671 A | | 4/2008 |

* cited by examiner

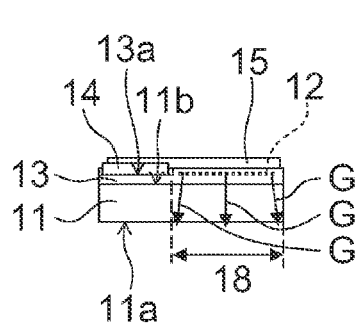
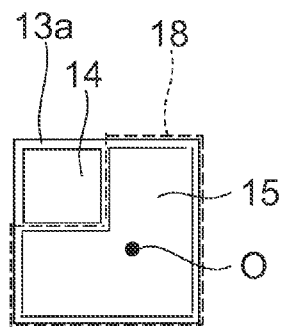
FIG. 2A    FIG. 2B
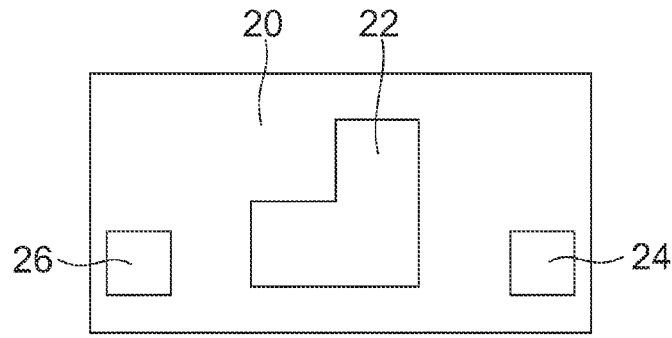
FIG. 2C
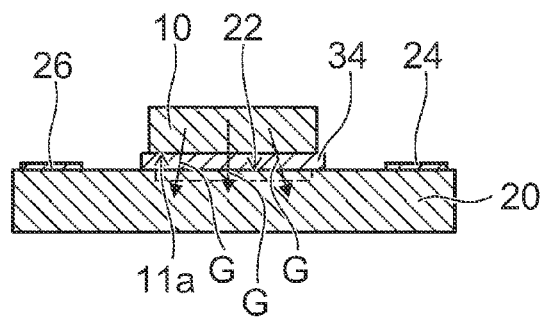
FIG. 2D
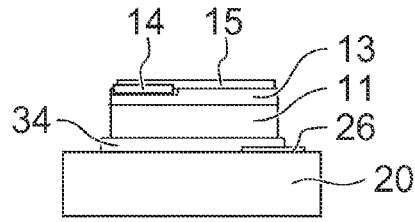
FIG. 2E

PHOTOCOUPLER

CROSS-REFERENCE TO RELATED APPLICATIONS

This application is based upon and claims the benefit of priority from Japanese Patent Application No. 2013-061150, filed on Mar. 22, 2013; the entire contents of which are incorporated herein by reference.

FIELD

Embodiments described herein relate generally to a photocoupler.

BACKGROUND

Photocouplers (including photorelays) convert an input electrical signal into an optical signal by using a light emitting element; and an electrical signal can be output by a light receiving element after receiving the optical signal. Therefore, the photocoupler can transmit the electrical signal in a state in which the input and output are insulated from each other.

In industrial equipment, office equipment, and household appliances, different power supply systems such as a DC voltage system, an AC power supply system, a telephone line system, a control system, etc., are disposed inside one device. However, operation errors may occur in the case where different power supply systems and circuit systems are directly coupled.

In such a case, normal operations can be maintained by using a photocoupler because the different power supplies are insulated from each other.

For example, many photocouplers are used in an inverter air conditioner or the like for a load that may be an alternating current load. In the case where photocouplers are used for signal switching in an integrated circuit tester application, an extremely large number of photocouplers are mounted; and it is extremely desirable to reduce the photocoupler size due to the need to reduce the mounting surface area on the substrate.

BRIEF DESCRIPTION OF THE DRAWINGS

FIG. 2A is a schematic side view of the light emitting element, FIG. 2B is a schematic plan view of the light emitting element, FIG. 2C is a schematic plan view of the light receiving element, FIG. 2D is a schematic cross-sectional view of section EX and FIG. 2E is a schematic side view of section EX;

DETAILED DESCRIPTION

In general, according to one embodiment, a photocoupler includes a light emitting element, a light receiving element, a bonding layer, input terminals, output terminals and a molded resin body. A light emitting element includes a support substrate having a first surface and a second surface on a side opposite to the first surface, a semiconductor stacked body provided at the second surface of the support substrate, and first and second electrodes provided at a surface of the semiconductor stacked body on a side opposite to the support substrate. The support substrate is transparent. The semiconductor stacked body includes a light emitting layer. The light emitting element has a light emitting surface of light emitted from the light emitting layer at the first surface of the support substrate. A light receiving element includes a light reception surface made of a p-n junction, a first electrode connected to a first conductivity type region of the p-n junction, and a second electrode connected to a second conductivity type region of the p-n junction. A bonding layer is configured to bond the first surface of the support substrate to the light reception surface side of the light receiving element. The bonding layer is transparent and insulative. Input terminals are connected respectively to the first and second electrodes of the light emitting element. Output terminals are connected respectively to the first and second electrodes of the light receiving element and insulated from the input terminals. A molded resin body covers the light emitting element and the light receiving element. The light reception surface is included in the light emitting surface as viewed from a direction perpendicular to the first surface. An input electrical signal input to the light emitting element is converted into an output electrical signal by the light receiving element.

Embodiments of the invention will now be described with reference to the drawings.

Figure 1A:
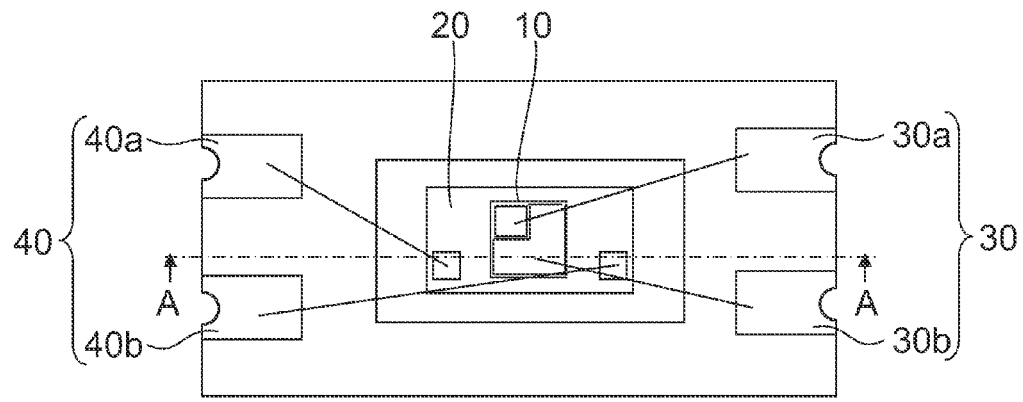
FIG. 1A is a schematic plan view of a photocoupler according to a first embodiment.
Figure 1B:
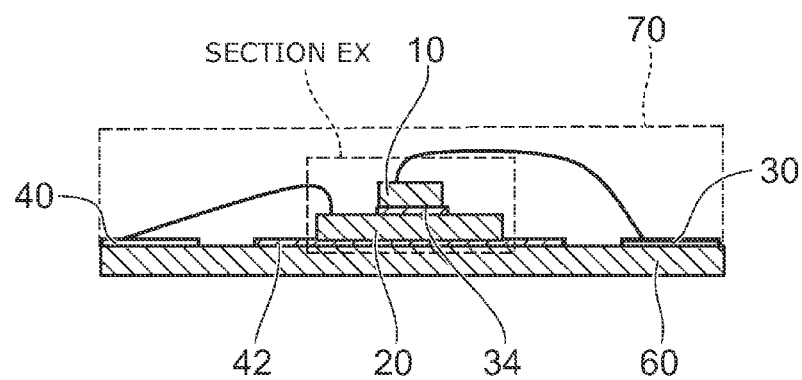
FIG. 1B is a schematic cross-sectional view along line A-A.

FIG. 1A is a schematic plan view of a photocoupler according to a first embodiment; and FIG. 1B is a schematic cross-sectional view along line A-A.

The photocoupler includes a light emitting element 10, a light receiving element 20, a bonding layer 34, input terminals 30, output terminals 40, and a molded resin body 70.

The light emitting element 10 includes a support substrate that is transparent, a semiconductor stacked body, a first electrode provided on the semiconductor stacked body, and a second electrode provided on the semiconductor stacked body. The light emitting element 10 may be, for example, a surface-emitting LED (Light Emitting Diode), etc.

The light receiving element 20 includes a first electrode and a second electrode on the light reception surface side of the light receiving element 20. The light receiving element 20 may be made of silicon, etc., and may be a photodiode, a photodiode array having multiple p-n junction regions, a phototransistor, a light receiving IC in which such components are integrated with a control circuit and/or an amplifier circuit, etc.

The bonding layer 34 is transparent and insulative and bonds the light emitting element 10 to the light reception surface side of the light receiving element 20. The bonding layer 34 may be an inorganic material including glass, $SiO_2$, etc., or a resin material such as acrylic, silicone, polyimide, etc. The light that is emitted downward from the light emitting layer is incident on the light reception surface by passing through the bonding layer 34.

The photocoupler may include the molded resin body 70 provided on an insulating substrate 60 to cover the light emitting element 10 and the light receiving element 20. Or, the photocoupler may include the molded resin body 70 provided to cover the light receiving element 20 provided on a lead and the light emitting element 10 provided on the light receiving element 20. The molded resin body 70 may include acrylic, epoxy, silicone, etc. The molded resin body 70 is illustrated by the broken line in FIG. 1B and is not shown in FIG. 1A.

The input terminals 30 and the output terminals 40 are provided at the front surface of the insulating substrate 60 and are electrically insulated. Therefore, the photocoupler can transmit an electrical signal in a state in which the input and output are insulated from each other.

FIG. 2A is a schematic side view of the light emitting element; FIG. 2B is a schematic plan view of the light emitting element; and FIG. 2C is a schematic plan view of the light receiving element. FIG. 2D is a schematic cross-sectional view of section EX; and FIG. 2E is a schematic side view of section EX.

As shown in FIG. 2A, a support substrate 11 that is transparent has a first surface 11a and a second surface 11b that is on the side opposite to the first surface 11a. A semiconductor stacked body 13 that includes a light emitting layer 12 (the dotted line) is provided on the second surface 11b. The semiconductor stacked body 13 has a stepped portion at the surface of the semiconductor stacked body 13 on the side opposite to the support substrate 11 side such that the stepped portion is from the front surface to a position lower than the light emitting layer 12. The stepped portion has a bottom surface 13a.

In the case where the support substrate 11 is made of GaAs, the bandgap wavelength of the support substrate 11 is about 870 nm. Therefore, the wavelength of emitted light G from the light emitting layer that has a MQW (Multi Quantum Well) structure, etc., may be, for example, longer than 870 nm and shorter than 1100 nm. In the case where the support substrate 11 is GaP having a bandgap wavelength of about 500 nm, the wavelength of the emitted light G may be 700 to 1100 nm, etc.

A first electrode 14 is provided at the bottom surface 13a of the stepped portion; and a second electrode 15 is provided at the front surface of the semiconductor stacked body 13 other than the stepped portion. In the case where the second electrode 15 covers the light emitting layer 12 from above, much of the emitted light traveling upward is reflected by the second electrode 15; and the upward emitted light can be reduced. The emitted light traveling downward from the light emitting layer 12 is emitted from a light emitting surface 18 of the back surface of the support substrate 11 and is incident on the light reception surface of the light receiving element 20. As shown in FIG. 2B, the light emitting surface 18 overlaps the light emitting layer 12 when viewed in plan, that is, as viewed from a direction perpendicular to the first surface 11a (or the second surface 11b).

It is favorable for a light reception surface 22 of the light receiving element 20 shown in FIG. 2C to be included in the light emitting surface 18 of the back surface of the light emitting element 10 when viewed in plan. Thus, the ambient light that is incident on the light reception surface can be suppressed because the light reception surface 22 does not jut from the semiconductor light emitting element 10. Therefore, misoperations of the photocoupler can be reduced. The light receiving element includes a first electrode 24 connected to one conductivity type layer of the p-n junction, and a second electrode 26 connected to the other conductivity type layer of the p-n junction.

FIG. 2D is a schematic cross-sectional view of section EX illustrated by the broken line in FIG. 1B. As shown in FIG. 2D, the emitted light G that is emitted from the light emitting surface 18 and passes through the bonding layer 34 is incident on the light reception surface 22. Because the bonding layer 34 is thin, the emitted light G from the light emitting element 10 is efficiently incident on the light reception surface 22 from the light emitting surface 18. FIG. 2E is a schematic side view of section EX; and the electrodes of the light emitting element 10 and the light receiving element 20 are connectable to the input terminals 30 and the output terminals 40 respectively by bonding wires, etc.

Figure 3A:
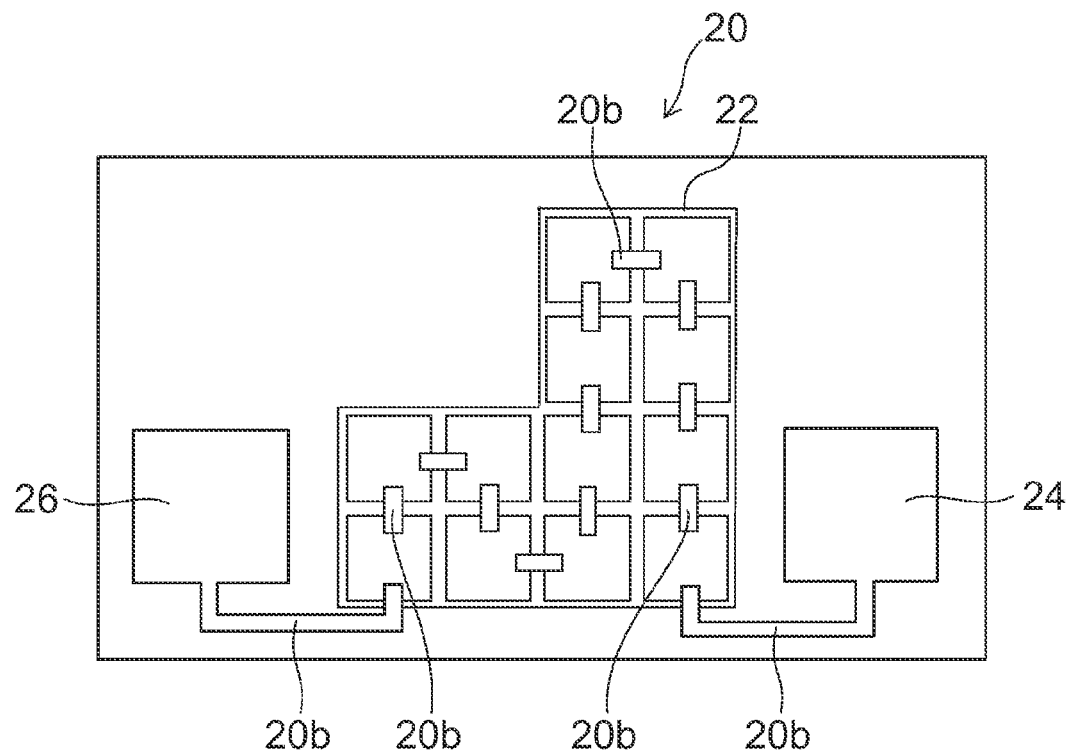
FIG. 3A is a schematic plan view of a pattern of the light reception surface of the light receiving element.
Figure 3B:
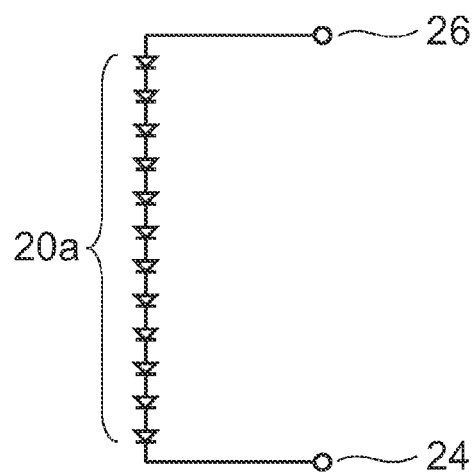
FIG. 3B is a connection diagram of a photodiode array.

FIG. 3A is a schematic plan view of a pattern of the light reception surface of the light receiving element; and FIG. 3B is a connection diagram of a photodiode array.

For example, the light receiving element 20 includes one photodiode made of one p-n junction that is multiply formed in a Si substrate to be mutually insulated. Further, the multiple silicon photodiodes are connected in series to form a photodiode array 20a. Such a configuration is favorable because a voltage that is not less than a threshold voltage Vth of the gate of the MOSFET that is built into the photocoupler can be supplied.

As shown in FIG. 3A, twelve photodiodes are connected in series by a metal interconnect unit 20b. Each of the photodiodes has a light reception surface made of a p-n junction and functions as a solar cell that generates photovoltaic power by receiving the light emitted from the light emitting element. In such a case, the light reception surface 22 is taken to be the region including the twelve photodiodes. One end portion of the photodiode array 20a is connected to the first electrode 24 by the metal interconnect unit 20b. One other end portion of the photodiode array 20a is connected to the second electrode 26 by the metal interconnect unit 20b.

The photovoltaic power per photodiode stage is about 0.6 V. On the other hand, it is not easy to set the threshold voltage Vth of the MOSFET to be 0.6 V or less. In other words, the MOSFET can be controlled to be reliably switched ON or OFF in the case where at least two stages of photodiodes are connected in series.

Figure 4:
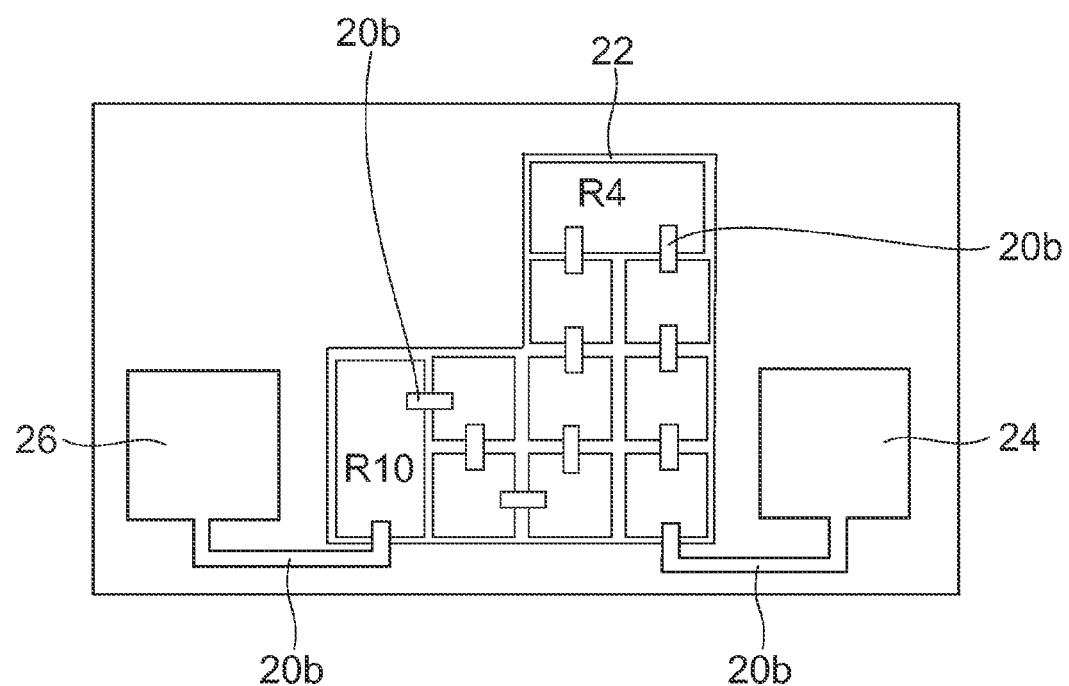
FIG. 4 is a schematic plan view of a first modification of the pattern of the light reception surface.

FIG. 4 is a schematic plan view of a first modification of the pattern of the light reception surface.

The multiple p-n junction regions may have regions of different sizes. The light intensity of the light emitted by the light emitting element 10 is a maximum on the optical axis passing through the center of light emission (illustrated by, for example, point O in FIG. 2B); and the light intensity decreases for regions distal to the optical axis. In the embodiment, an extreme decrease of the photovoltaic power is suppressed because the light reception surface 22 does not jut outside the light emitting surface 18 of the light emitting element 10.

However, there are cases where the current density decreases at regions R4 and R10 that are distal to the optical axis. In such a case, it is easy for the current of the regions R4 and R10 to approach the current of the p-n junction regions having the small planar sizes where the light intensity is high by increasing the surface areas of the p-n junctions of the regions R4 and R10. In other words, a maximum output point Pmax as a solar cell can be increased by setting the planar sizes of the p-n junction regions to the appropriate values.

Figure 5A:
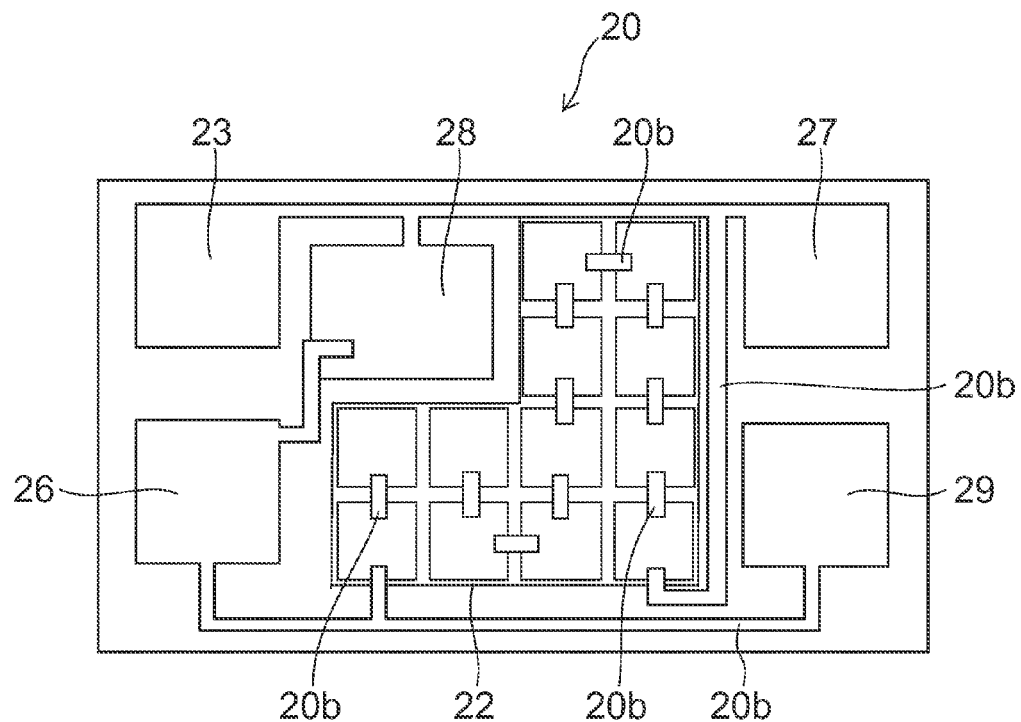
FIG. 5A is a schematic plan view of a second modification of the pattern of the light reception surface.
Figure 5B:
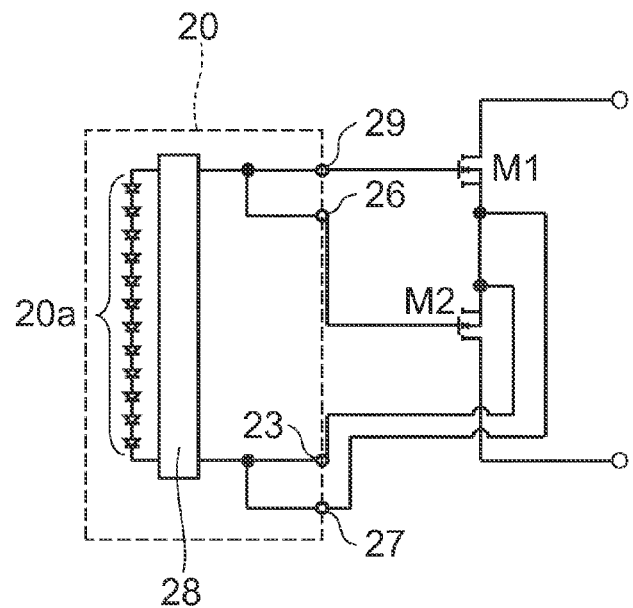
FIG. 5B is a connection diagram of the photodiode array.

FIG. 5A is a schematic plan view of a second modification of the pattern of the light reception surface; and FIG. 5B is a connection diagram of the photodiode array.

As shown in FIG. 5A, the light receiving element 20 may further include a control circuit 28. The control circuit 28 is connected to a first electrode 27 and the second electrode 26 of the photodiode array 20a. By using such a configuration, a voltage can be supplied to the gates of MOSFETs (M1 and M2).

For example, the MOSFETs (M1 and M2) may be n-channel enhancement mode MOSFETs. As shown in FIG. 5B, the MOSFETs (M1 and M2) have common-source connections and are connected to the second electrode 26 of the photodiode array 20a. The gates are connected to the first electrode 27; and the drains are used as the output terminals 40.

When the optical signal is ON, both of the MOSFETs (M1 and M2) are switched ON and are connected to an external circuit via the output terminals 40. On the other hand, when the optical signal is OFF, both of the MOSFETs (M1 and M2) are switched OFF; and the connections to the external circuit are broken.

Figure 6:
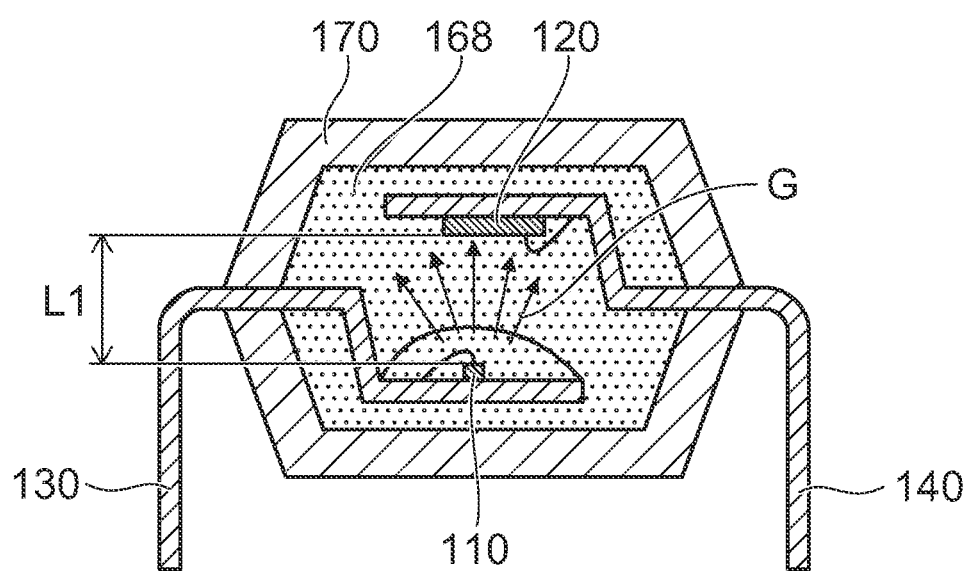
FIG. 6 is a schematic cross-sectional view of an opposed-type photocoupler according to a comparative example.

FIG. 6 is a schematic cross-sectional view of an opposed-type photocoupler according to a comparative example.

In the comparative example, a light emitting element 110 that is bonded to input leads 130 and a light receiving element 120 that is bonded to output leads 140 are provided to oppose each other while maintaining a separation distance L1 inside a transparent resin layer 168. Therefore, the emitted light spreads; only a portion of the light can reach the light reception surface; and the current is low, i.e., about 2.5 µA. Moreover, it is necessary to provide a light-shielding resin layer 170 to cover the transparent resin layer 168. In such a structure shown in FIG. 6, there is a limit to how much the separation distance L1 can be reduced.

Conversely, in the first embodiment, the spread of the emitted light is reduced because the separation distance is the thickness of the bonding layer 34 and is small; and the current can be increased to about 13 µA. Also, it is easy to make the photocoupler thinner and reduce the mounting surface area.

Figure 7A:
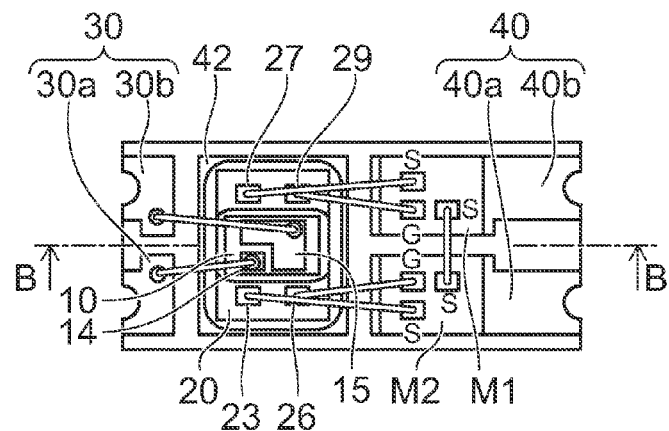
FIG. 7A is a schematic plan view of a photocoupler according to a second embodiment.
Figure 7B:
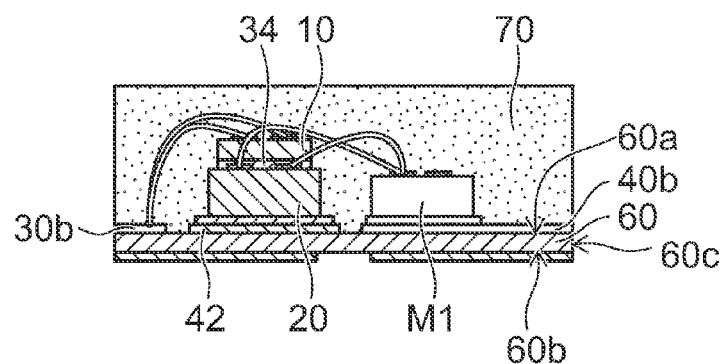
FIG. 7B is a schematic cross-sectional view along line B-B and FIG. 7C is a configuration diagram of the photocoupler.
Figure 7C:
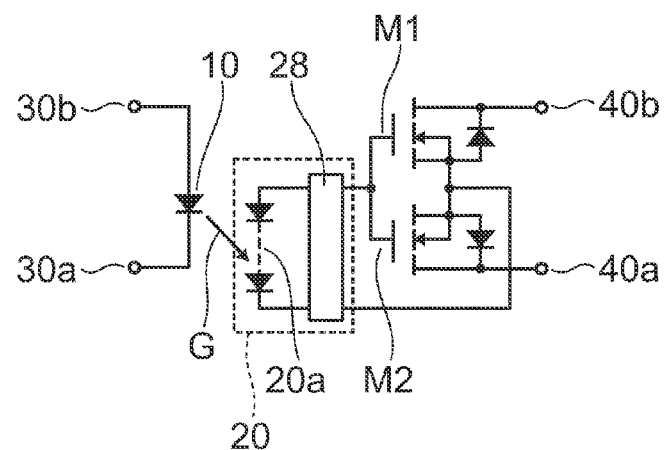

FIG. 7A is a schematic plan view of a photocoupler according to a second embodiment; FIG. 7B is a schematic cross-sectional view along line B-B; and FIG. 7C is a configuration diagram of the photocoupler.

The photocoupler according to the second embodiment includes the light emitting element 10, the light receiving element 20, the MOSFETs (M1 and M2), the bonding layer 34, the input terminals 30, the output terminals 40, and the molded resin body 70.

Although the MOSFETs (M1 and M2) are n-channel enhancement mode MOSFETs in the drawings, the invention is not limited thereto. The channel conductivity type of the MOSFETs (M1 and M2) may be opposite to the polarity of the photodiode array 20a. Or, the MOSFETs may be depletion mode MOSFETs.

In the drawings, the photocoupler further includes the insulating substrate 60. A thick film including a metal is provided on an upper surface 60a, a lower surface 60b, and a side surface 60c of the insulating substrate 60; and plated conductive layers of Au, Ag, Cu, etc., are provided on the thick film. The conductive layers include the input terminals 30 (30a and 30b), the output terminals 40 (40a and 40b), a die pad unit 42 made of a conductive layer of Au, Ag, Pd, etc., to which the light receiving element 20 is bonded, etc.

The light emitting element 10 is bonded on the light receiving element 20 by the bonding layer 34. After wire bonding is performed, the molded resin body 70 is provided to cover the light emitting element 10, the light receiving element 20, the conductive layers, and the insulating substrate 60. FIG. 7A is a schematic plan view prior to providing the molded resin body 70. The insulating substrate 60 may be a glass epoxy material, a ceramic material, etc. It is favorable for the molded resin body 70 to be light-shielding to further reduce the misoperations due to ambient light.

The input terminals 30 and the output terminals 40 may be conductive layers that are continuously provided at the upper surface 60a, the lower surface 60b, and the side surface 60c of the insulating substrate 60. In such a case, for example, a recess may be provided in the side surface 60c of the insulating substrate 60; and the recess may be used as a solder fillet by providing a conductive layer on the surface of the recess. Also, the lower surface of each of the input terminals 30 and the output terminals 40 may be exposed from the molded resin body 70 and may be bonded to the mounting substrate. In other words, as shown in FIG. 7C, the second embodiment may be, for example, a photocoupler including the four terminals 30a, 30b, 40a, and 40b.

The suitability for mass production of the photocoupler assembled on the insulating substrate 60 is good because the process of bending the leadframe is unnecessary, the lead cut process is unnecessary, and the resin layer may be only one layer. Also, it is easy to reduce the thickness.

For example, the light receiving element 20 may include the control circuit 28. The control circuit 28 drives the gates of the MOSFETs (M1 and M2) having common-source connections by the photovoltaic power of the photodiode array 20a. When an alternating current load is connected between the first lead 40a and the second lead 40b of the output terminals 40 connected to the drains, a continuous sine wave can be output while maintaining low losses as in a mechanical relay.

The photocoupler having the configuration of FIG. 7C may be called a photorelay and can be widely used in FAX modems, integrated circuit testers, etc.

The light receiving element 20 (including the control circuit 28) and the MOSFETs (M1 and M2) of FIG. 7C may be included in a single-chip IC. The single-chip IC may be bonded to the die pad unit 42.

According to the first and second embodiments, a photocoupler for which it is easy to generate photovoltaic power, reduce the mounting surface area, and reduce the photocoupler thickness is provided. Such a photocoupler can be used in an inverter air conditioner, an integrated circuit tester, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A photocoupler comprising:
   a light emitting element including a substrate having a first surface and a second surface opposite to the first surface, a semiconductor stacked body provided at the second surface of the substrate, and first and second electrodes provided at a surface of the semiconductor stacked body, the semiconductor stacked body including a light emitting layer, the light emitting element having a light emitting surface of light emitted from the light emitting layer at the first surface of the substrate;
a light receiving element including a p-n junction, a first electrode connected to a first conductivity type region of the p-n junction, and a second electrode connected to a second conductivity type region of the p-n junction, and the light receiving element including a light reception surface;
a bonding layer configured to bond the first surface of the substrate to the light reception surface side of the light receiving element, the bonding layer being transparent and insulative;
first terminals connected respectively to the first and second electrodes of the light emitting element;
second terminals connected respectively to the first and second electrodes of the light receiving element, the second terminals being insulated from the input terminals; and
a molded resin body covering the light emitting element and the light receiving element,
the light reception surface being provided opposite to the second electrode of the light emitting element but not being provided opposite to the first electrode of the light emitting element, a shape of the light reception surface being the same as a shape of the second electrode of the light emitting element.

2. The photocoupler according to claim 1, wherein the first and second electrodes of the light receiving element are directly connected to the output terminals.

3. The photocoupler according to claim 2, wherein
the light reception surface includes a plurality of p-n junctions connected in series by a metal interconnect unit, and
the first and second electrodes of the light receiving element are connected respectively to two ends of the plurality of p-n junctions.

4. The photocoupler according to claim 3, wherein the plurality of p-n junctions have regions of different sizes.

5. The photocoupler according to claim 4, wherein a surface area of the p-n junction region having a long distance from an optical axis of the emitted light is greater than a surface area of the p-n junction having a short distance from the optical axis.

6. The photocoupler according to claim 1, further comprising a MOSFET provided between the light receiving element and the output terminal,
the MOSFET including a gate connected to the first electrode of the light receiving element, a source connected to the second electrode of the light receiving element, and a drain connected to the output terminals.

7. The photocoupler according to claim 6, wherein
the MOSFET includes two MOSFETs having a common-source connection,
photovoltaic power generated in the light receiving element by irradiation of the emitted light causes each of the MOSFETs to switch ON, and
an output electrical signal corresponding to the input electrical signal is output from the drain of the first MOSFET and the drain of the second MOSFET.

8. The photocoupler according to claim 7, wherein
the light reception surface includes a plurality of p-n junctions connected in series by a metal interconnect unit, and
the first and second electrodes of the light receiving element are connected respectively to two ends of the plurality of p-n junctions.

9. The photocoupler according to claim 8, wherein the plurality of p-n junctions have regions of different sizes.

10. The photocoupler according to claim 9, wherein a surface area of the p-n junction region having a long distance from an optical axis of the emitted light is greater than a surface area of the p-n junction having a short distance from the optical axis.

11. The photocoupler according to claim 1, wherein the bonding layer includes one selected from glass, a silicon oxide film, and a resin.

12. The photocoupler according to claim 1, wherein a wavelength of the emitted light is not less than 700 nm and not more than 1100 nm.

13. A photocoupler comprising:
a light emitting element including a GaAs substrate having a first surface and a second surface opposite to the first surface, a semiconductor stacked body provided at the second surface of the GaAs substrate, and first and second electrodes provided at a surface of the semiconductor stacked body opposite to the GaAs substrate, the semiconductor stacked body including a light emitting layer, a wavelength of light emitted from the light emitting layer being longer than a bandgap wavelength of the GaAs substrate, the light emitting element having a light emitting surface at the first surface of the GaAs substrate;
a light receiving element including two p-n junctions connected in series, a first electrode connected to a first conductivity type region of the first p-n junction, and a second electrode connected to a second conductivity type region of the second p-n junction, and the light receiving element including a light reception surface;
a bonding layer configured to bond the first surface of the GaAs substrate to the light reception surface side of the light receiving element, the bonding layer being transparent and insulative;
first terminals connected respectively to the first and second electrodes of the light emitting element;
second terminals connected respectively to the first and second electrodes of the light receiving element, the second terminals being insulated from the input terminals;
a MOSFET including a gate connected to the first electrode of the light receiving element, a source connected to the second electrode of the light receiving element, and a drain connected to the second terminal; and
a molded resin body covering the light emitting element, the light receiving element, and the MOSFET, the molded resin body being light-shielding,
the light reception surface being provided opposite to the second electrode of the light emitting element but not being provided opposite to the first electrode of the light emitting element, a shape of the light reception surface being the same as a shape of the second electrode of the light emitting element.

14. The photocoupler according to claim 13, wherein the bonding layer includes one selected from glass, a silicon oxide film, and a resin.

15. The photocoupler according to claim 13, wherein a wavelength of the emitted light is not less than 700 nm and not more than 1100 nm.

* * * * *